US012205658B2

(12) United States Patent
Gupta et al.

(10) Patent No.: US 12,205,658 B2
(45) Date of Patent: Jan. 21, 2025

(54) SYSTEMS AND METHODS FOR RETAINING INFLIGHT DATA DURING A POWER LOSS EVENT

(71) Applicant: SanDisk Technologies LLC, Addison, TX (US)

(72) Inventors: Shantanu Gupta, Fremont, CA (US); Amiya Banerjee, Karnataka (IN); Harish Singidi, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 3 days.

(21) Appl. No.: 17/509,411

(22) Filed: Oct. 25, 2021

(65) Prior Publication Data

US 2023/0129097 A1    Apr. 27, 2023

(51) Int. Cl.
| | | |
|---|---|---|
| *G11C 16/10* | (2006.01) | |
| *G11C 7/10* | (2006.01) | |
| *G11C 16/14* | (2006.01) | |
| *G11C 16/26* | (2006.01) | |
| *G11C 16/34* | (2006.01) | |

(52) U.S. Cl.
CPC ........ *G11C 16/3481* (2013.01); *G11C 7/1039* (2013.01); *G11C 16/102* (2013.01); *G11C 16/14* (2013.01); *G11C 16/26* (2013.01)

(58) Field of Classification Search
CPC . G11C 16/3481; G11C 16/105; G11C 16/102; G11C 16/14
See application file for complete search history.

(56) References Cited

U.S. PATENT DOCUMENTS

| | | | |
|---|---|---|---|
| 2009/0082918 A1* | 3/2009 | Hendrix, Jr. ......... | G07C 5/0858 |
| | | | 701/31.4 |
| 2017/0125117 A1* | 5/2017 | Tseng ..................... | G11C 16/10 |
| 2018/0350445 A1* | 12/2018 | Linnen .................... | G11C 7/22 |
| 2020/0151104 A1* | 5/2020 | Yang .................. | G06F 12/0804 |

\* cited by examiner

*Primary Examiner* — Anthan Tran

(74) *Attorney, Agent, or Firm* — Dickinson Wright PLLC; Steven C. Hurles

(57) ABSTRACT

Memory devices, or memory systems, described herein may include a controller (e.g., SSD controller) and a NAND memory device for storing inflight data. When the power loss event occurs, a memory system maintains (i.e., not un-select) the existing memory block being programmed at the time of power loss. The existing program operation at the event of power loss can be suspended by controller. The inflight data can be re-sent by controller directly to NAND latches, when power loss event was detected. The memory system can select a next, immediate available erased page and begin one-pulse programming to store the inflight data, without ramping down the program pump and program pulse, which was in use before the power loss event. The existing programming voltage is used to store/program the inflight data via single pulse programming. When power is restored, the inflight data is moved/programmed to another block for good data reliability.

7 Claims, 14 Drawing Sheets

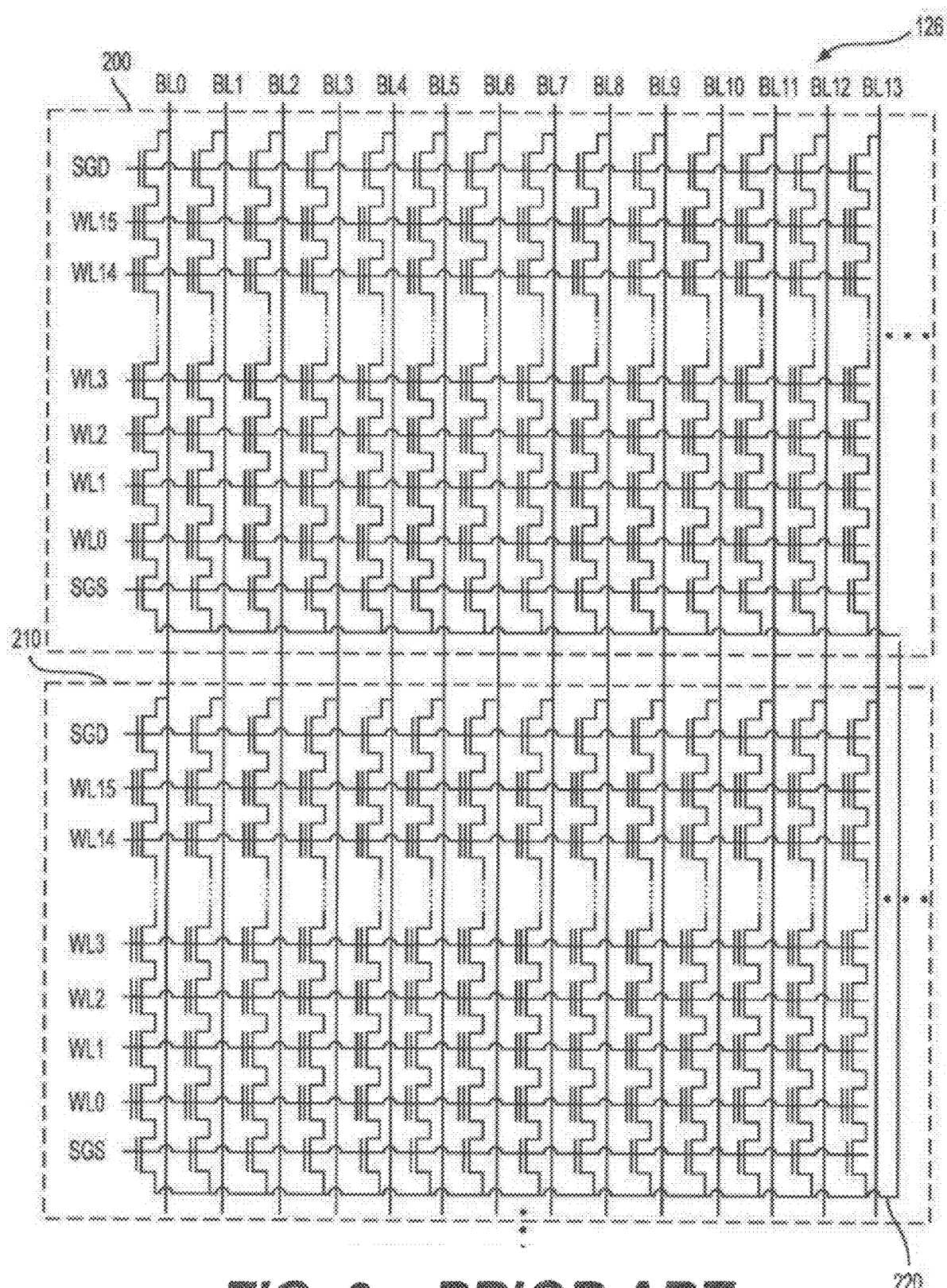
FIG. 2 – PRIOR ART –

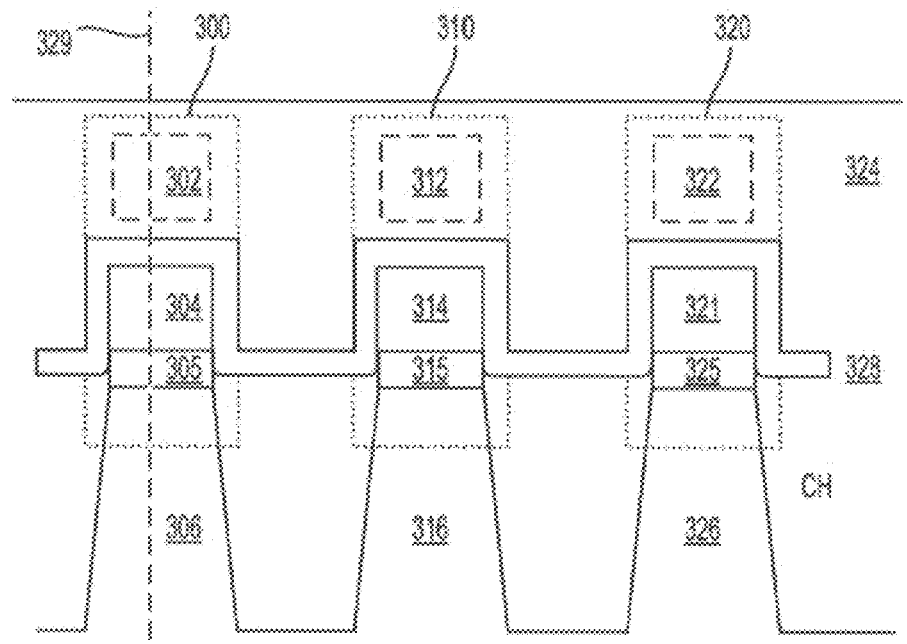
*FIG. 3A – PRIOR ART –*
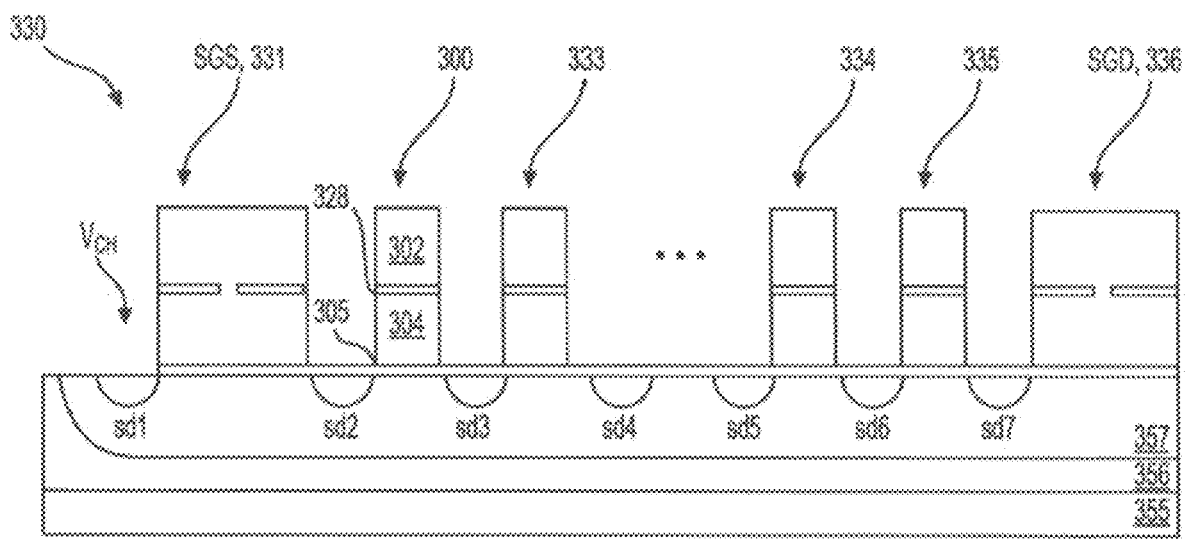
*FIG. 3B – PRIOR ART –*

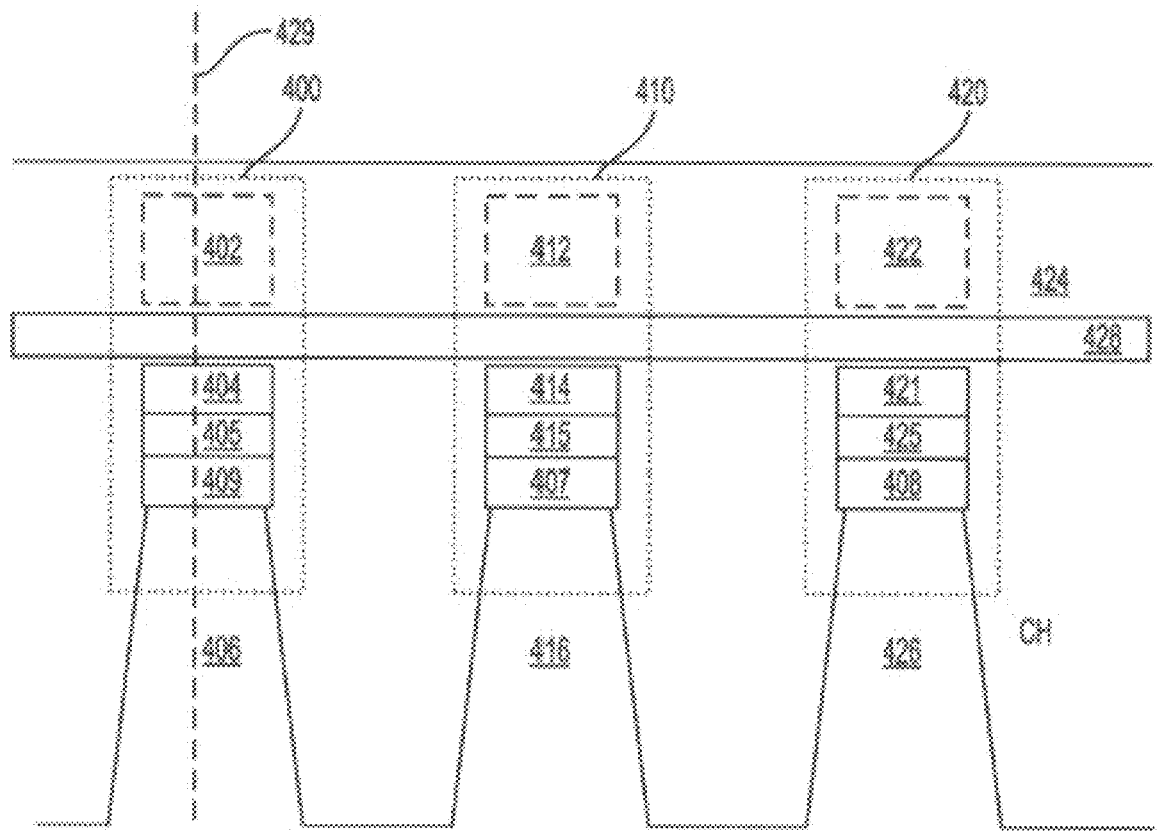
*FIG. 4A – PRIOR ART –*
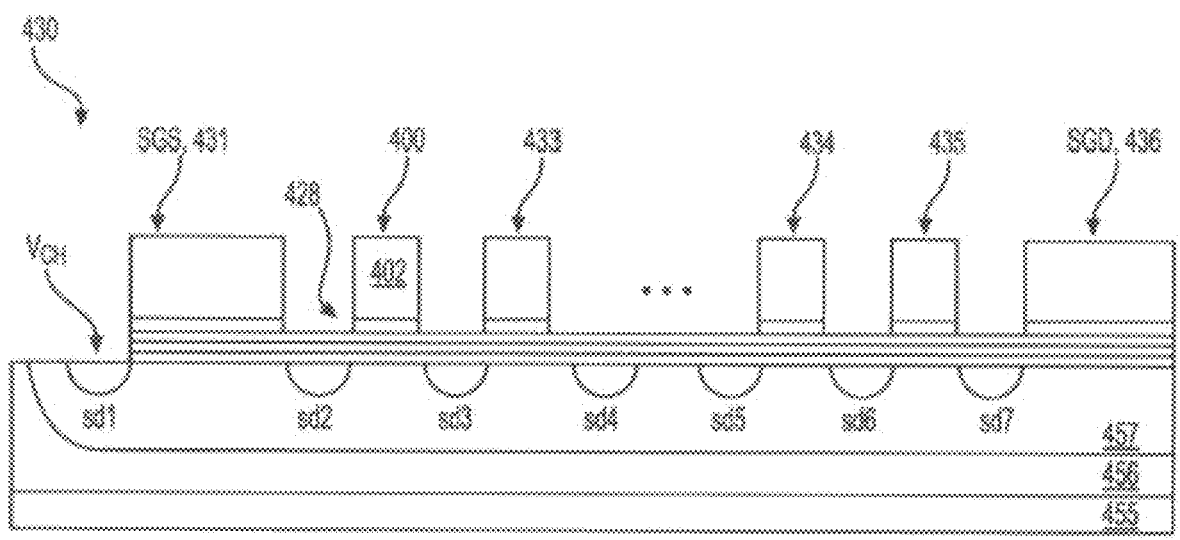
*FIG. 4B – PRIOR ART –*

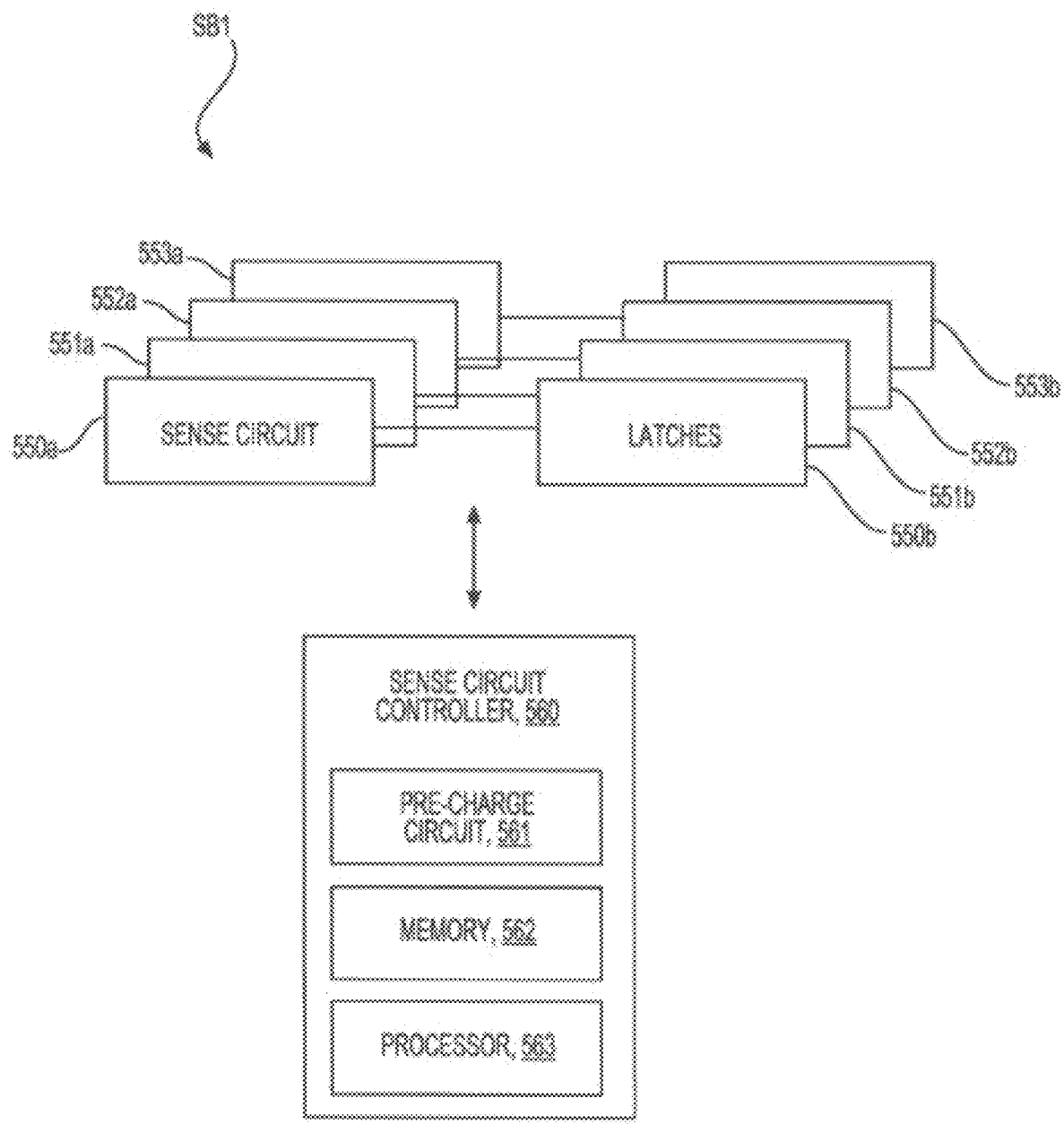
FIG. 5 – PRIOR ART –

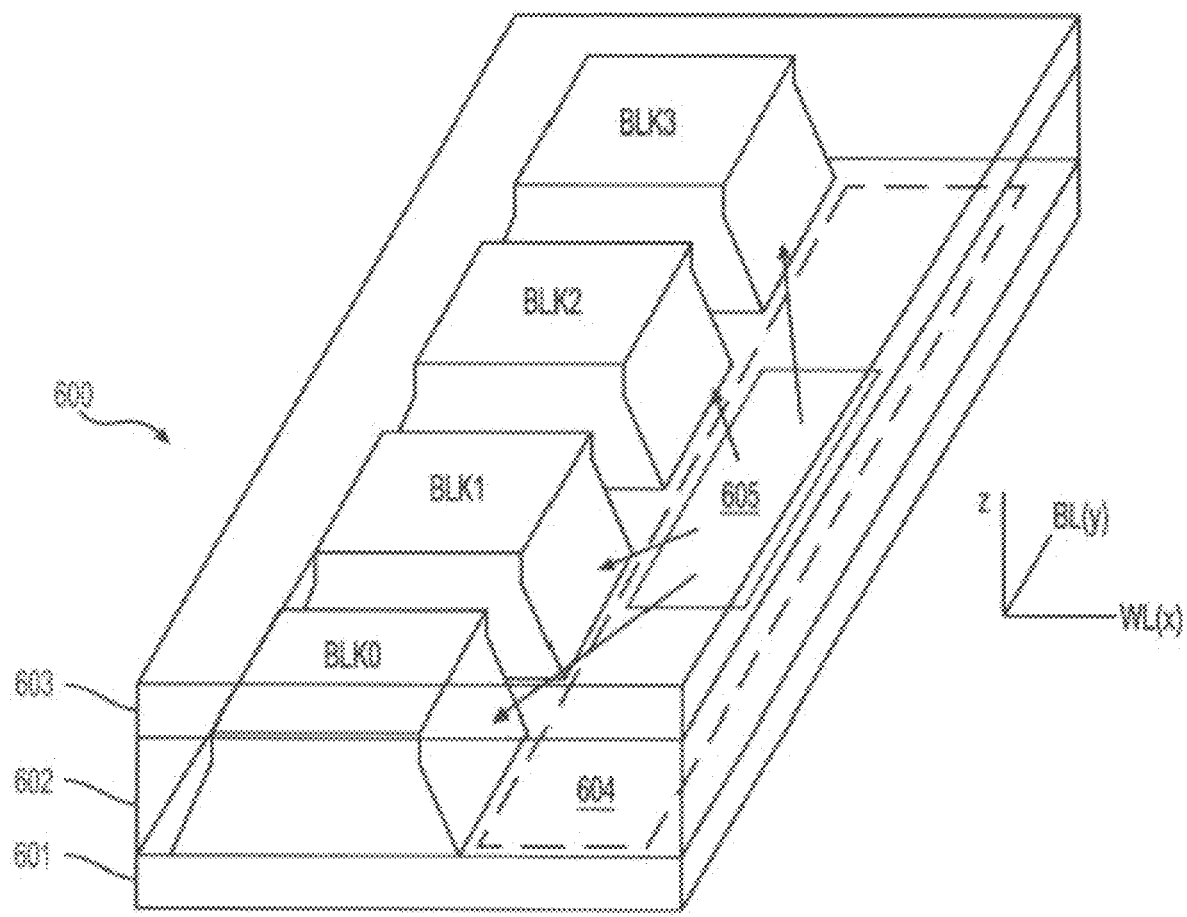
FIG. 6A – PRIOR ART –

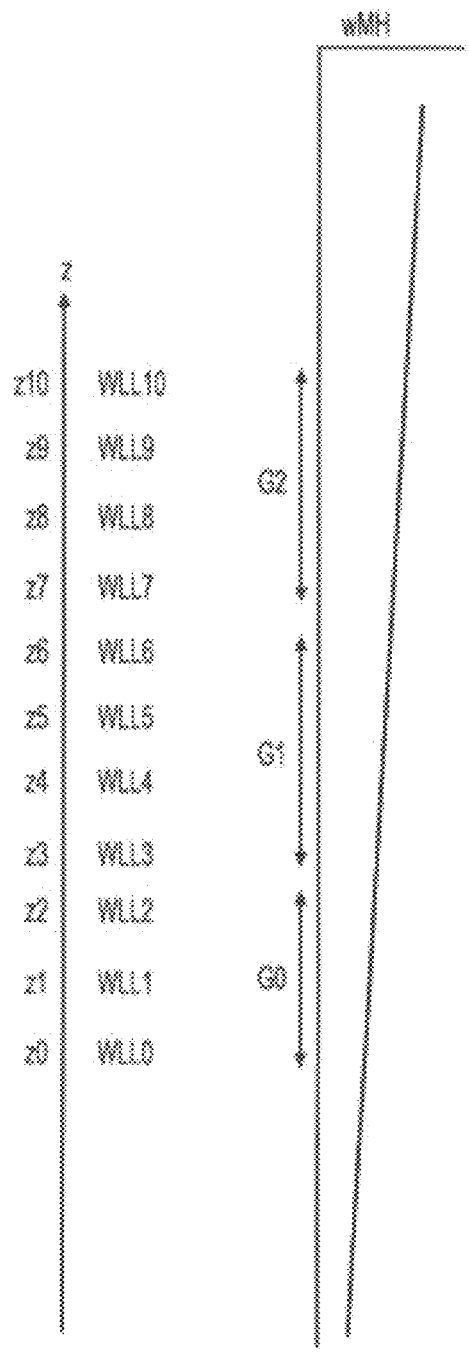
FIG. 6C – PRIOR ART –

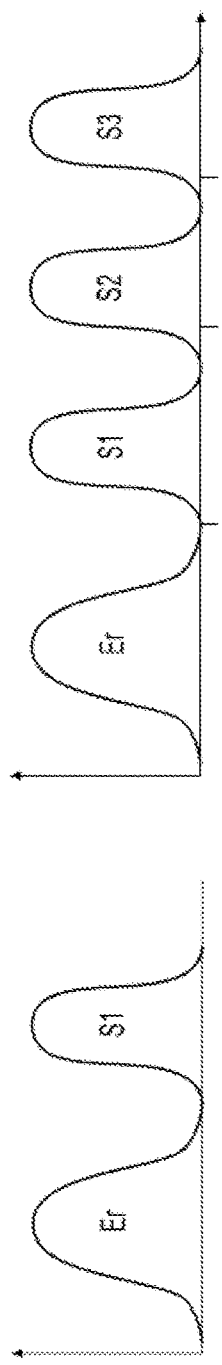
FIG. 8
FIG. 9
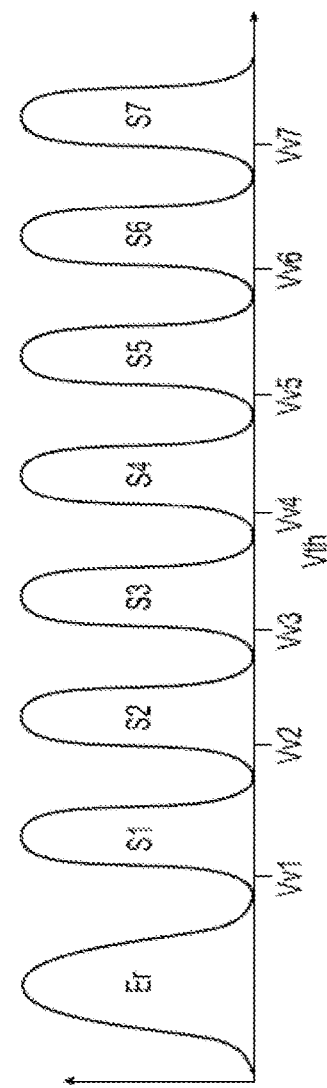
FIG. 10
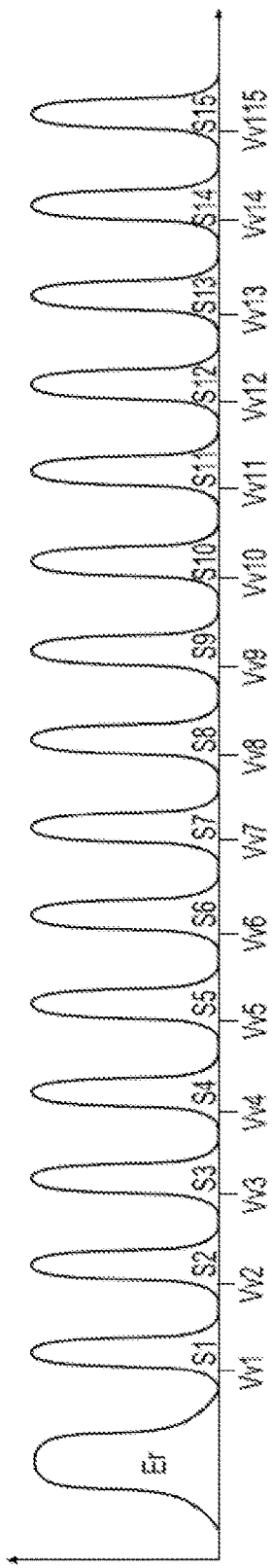
FIG. 11

SYSTEMS AND METHODS FOR RETAINING INFLIGHT DATA DURING A POWER LOSS EVENT

TECHNICAL FIELD

This application is directed to memory backup/retention during a programming operation when a sudden loss of power occurs. Exemplary programming operations described herein including programming, or writing, to storage devices (e.g., NAND). In particular, this application describes a faster and more efficient response to moving partially programmed (e.g., inflight) host data to the NAND during a power loss event, thereby avoiding data loss. Additionally, the described processes can be implemented under low-power conditions.

BACKGROUND

Power losses, including unexpected power losses, may occur during a programming operation, which can lead to programming errors and/or data loss. In some instances, supplemental power is provided by capacitors. These capacitors are designed to hold enough charge to allow a storage system to flush, or transfer, inflight data to a NAND device. However, the use of capacitors can consume significant energy and add to the manufacturing cost of memory devices. Larger, enterprise systems having multiple NAND dies requires larger capacitors to store more energy, which further increases cost.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, ..., SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory structure 126 of FIG. 1. The memory structure 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell structure 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

FIG. 6A is a perspective view of a set of blocks 600 in an example three-dimensional configuration of the memory structure 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

SUMMARY

According to an aspect of the present disclosure is related to a method for retaining inflight data during a power loss event is disclosed. The method includes one or more steps performed by a controller of a memory device that includes a memory block. The method includes receiving an indication of the power loss event. The method includes suspending, based on the indication, a programming operation of inflight data to a page of the memory block. The method includes identifying an erased page address on the memory block. The method includes providing the inflight data to a buffer. The method includes programming the inflight data to the erased page. The method includes, when a power restoration event occurs, relocating the inflight data.

In an embodiment, receiving the indication comprises receiving a prefix command.

In an embodiment, the erased page defines a next immediate erased page after the erased page.

In an embodiment, programming the inflight data comprises single pulse programming.

In an embodiment, the method includes utilizing an initial programming voltage, prior to the power loss event, to perform the one-pulse programming.

In an embodiment, the single pulse programming occurs without ramping down a programming pump In an embodiment, the relocating the inflight data comprises programming the inflight data to a subsequent block of the memory device.

According to another aspect of the disclosure, a memory system is disclosed. The memory system includes a memory device comprising a memory block. The memory system includes a controller operatively coupled to the memory device. The controller is configured to receive an indication of the power loss event. The controller is configured to suspend, based on the indication, a programming operation of inflight data to a page of the memory block. The controller is configured to provide the inflight data to a buffer. The controller is configured to identify an erased page address on the memory block. The controller is configured to program the inflight data to the erased page. The controller is configured to, when a power restoration event occurs, relocate the inflight data.

In an embodiment, the received indication includes a received a prefix command.

In an embodiment, the erased page defines a next immediate erased page after the erased page.

In an embodiment, the controller is configured to program the inflight data comprises single pulse programming.

In an embodiment, the controller is configured to utilize an initial programming voltage, prior to the power loss event, to perform the single pulse programming.

In an embodiment, the single pulse programming occurs without ramping down a programming pump.

In an embodiment, the memory block is a first memory block and the relocated inflight data is programmed to a subsequent block.

According to another aspect of the disclosure, a non-transitory computer readable storage medium configured to store instructions that, when executed by a processor included a controller of a memory system, cause the memory system to carry out steps is disclosed. The steps include receive an indication of the power loss event. The steps include suspend, based on the indication, a programming operation of inflight data to a page of a memory block. The steps include provide the inflight data to a buffer. The steps include identify an erased page address on the memory block. The steps include program the inflight data to the erased page. The steps include, when a power restoration event occurs, relocate the inflight data.

In an embodiment, the received indication includes a received a prefix command.

In an embodiment, the erased page defines a next immediate erased page after the erased page.

In an embodiment, the controller is configured to program the inflight data comprises single pulse programming.

In an embodiment, the controller is configured to utilize an initial programming voltage, prior to the power loss event, to perform the single pulse programming.

In an embodiment, the single pulse programming occurs without ramping down a programming pump.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 2 illustrates schematic views of three types of memory architectures utilizing staggered memory strings;

FIG. 3A illustrates a cross-sectional view of example floating gate memory cells in NAND strings;

FIG. 3B illustrates a cross-sectional view along a contact line shown in FIG. 3A;

FIGS. 4A and 4B illustrate non-volatile memory in which a charge-trapping memory cell uses a non-conductive dielectric material in place of a conductive floating gate to store charge in a non-volatile manner;

FIG. 5 illustrates an example block diagram of the sense block of FIG. 1;

FIG. 6A is a perspective view of a set of blocks in an example three-dimensional configuration of the memory array of FIG. 1;

FIG. 6C illustrates a plot of memory hole diameter in the stack of FIG. 6B;

FIG. 8 illustrates the Vth distributions of the data states in an SLC memory system;

FIG. 9 illustrates the Vth distributions of the data states in a MLC memory system;

FIG. 10 illustrates the Vth distributions of the data states in a TLC memory system;

FIG. 11 illustrates the Vth distributions of the data states in a QLC memory system;

DETAILED DESCRIPTION

Figure 1A:
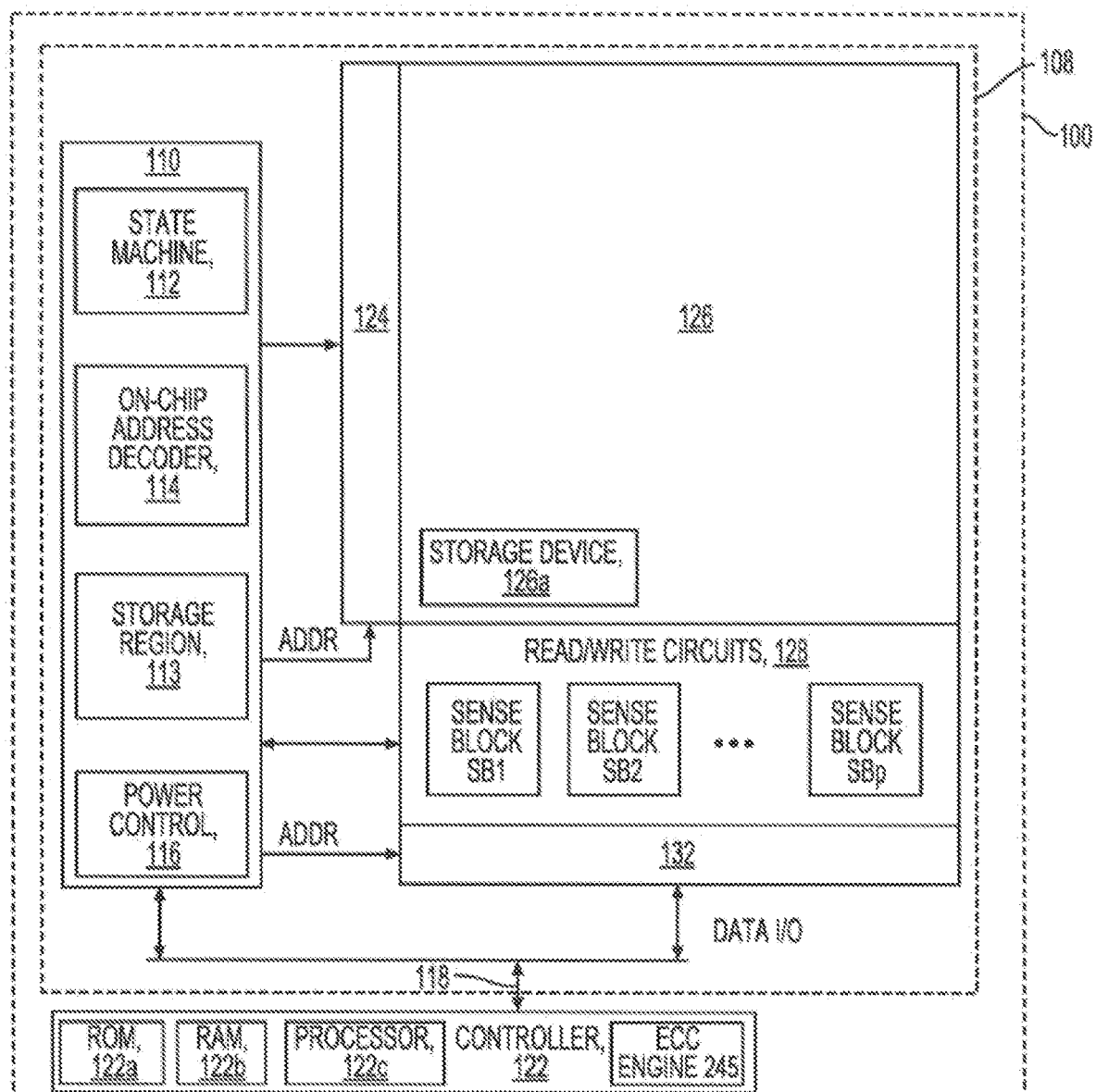
FIG. 1A is a block diagram of an example memory device.
Figure 1B:
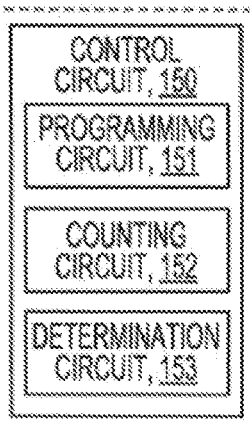
FIG. 1B is a block diagram of an example control circuit that includes a programming circuit, a counting circuit, and a determination circuit.
Figure 6B:
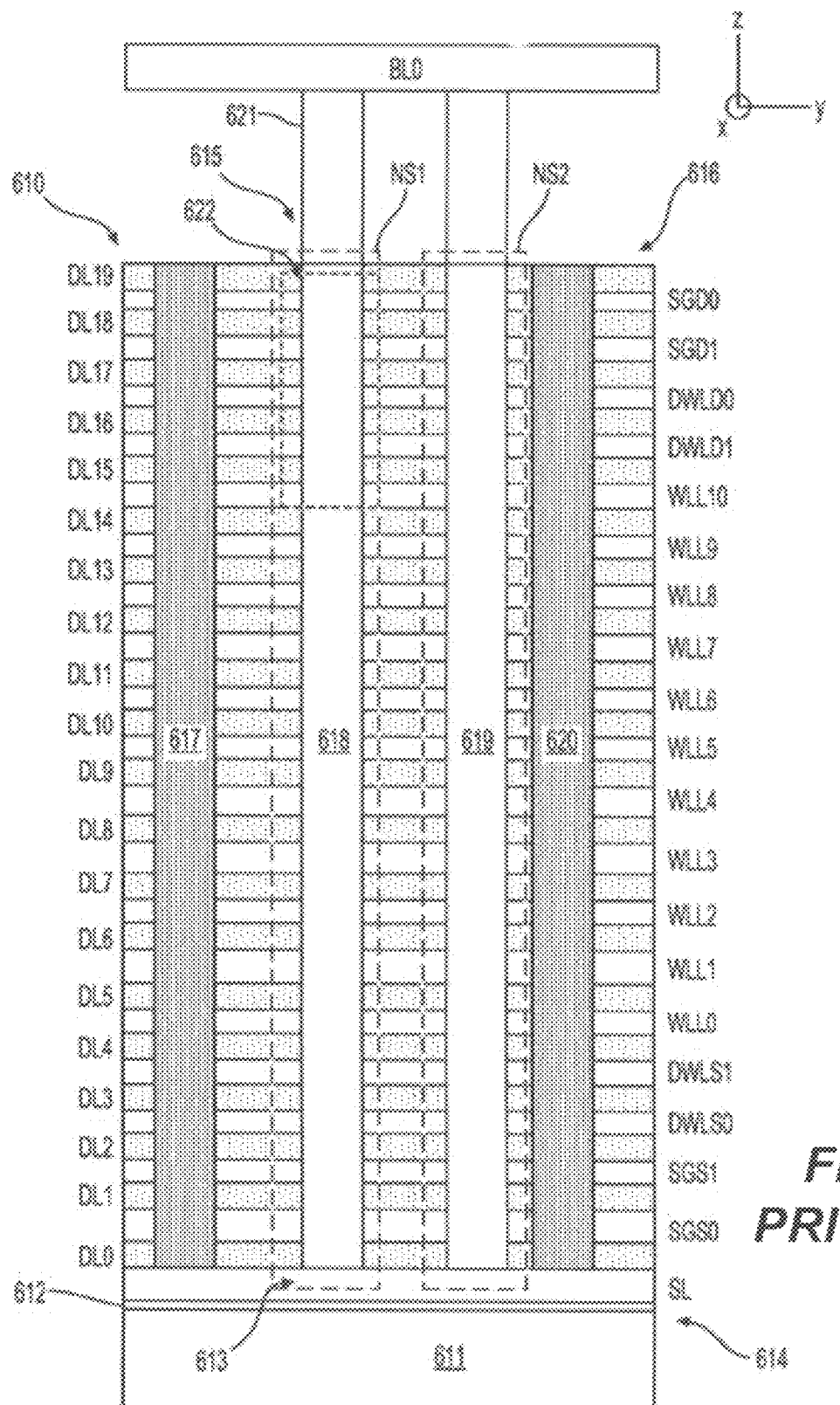
FIG. 6B illustrates an example cross-sectional view of a portion of one of the blocks of FIG. 6A.
Figure 6D:
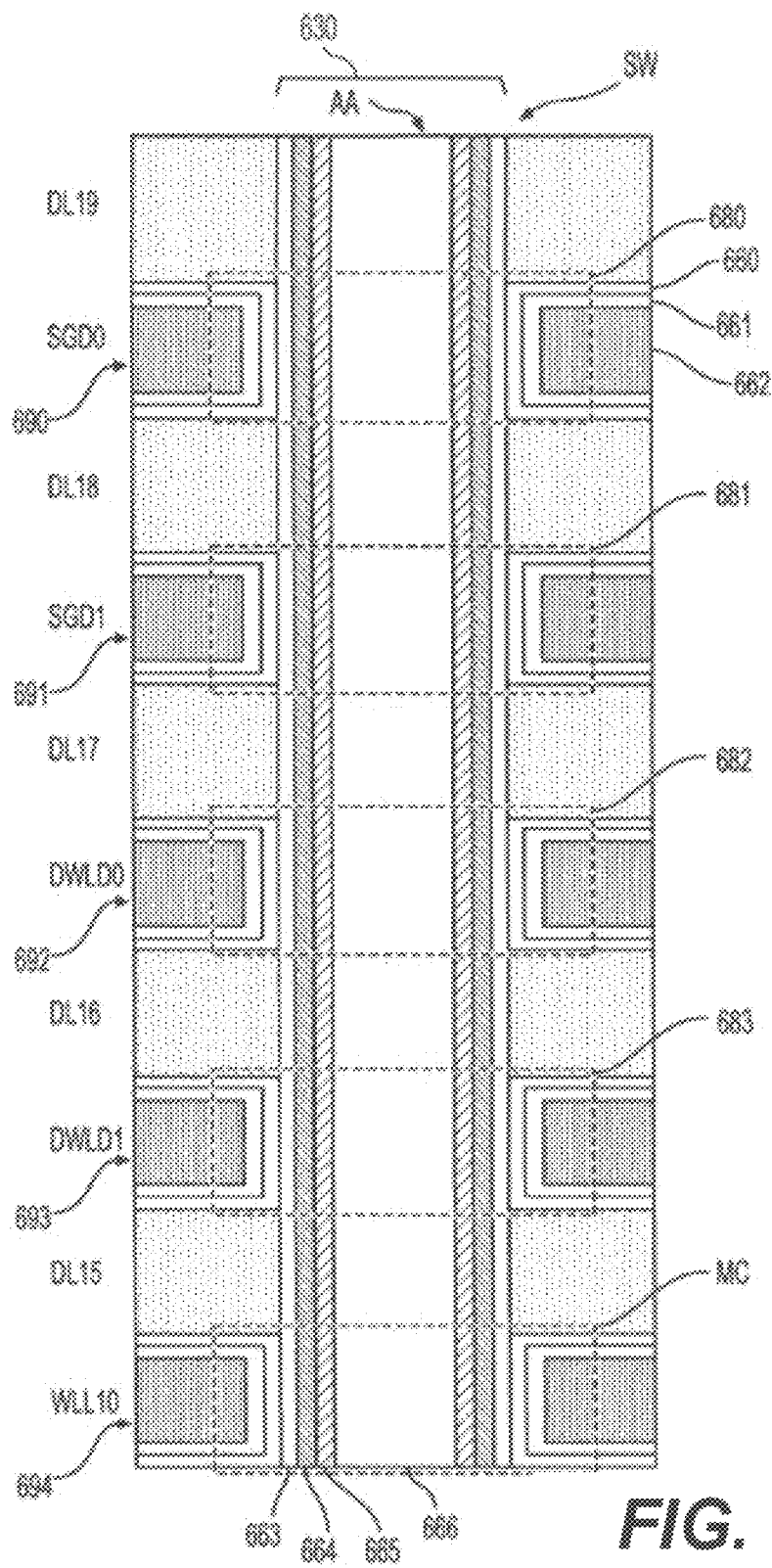
FIG. 6D illustrates a close-up view of the region of the stack of FIG. 6B.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The following disclosure is directed to NAND design enhancements for efficient flushing (e.g., syncing data in a temporary state to a permanent state) of inflight data during a power loss event. Exemplary power loss events include a sudden loss of power for any number of unforeseen reasons, including but not limited to removal of a memory device from a computing device or loss of power at a (server) rack. In order to carry out this procedure in an efficient manner (thus mitigating or prevent data loss), a memory system can use single-layer cell ("SLC") programming of inflight host data in NAND latches during a power loss event. The host data, including multi-level data (e.g., multi-level cell ("MLC"), triple-level cell ("TLC"), or quad-level cell ("QLC")), can be temporarily programmed to a NAND block by alternate means. A system controller (e.g., memory controller), as part of a memory device or memory system, described herein is designed to take several steps to ensure efficient data storage.

In an exemplary embodiment, using an identifier (e.g., prefix command), the controller instructs the NAND memory device to execute instructions (or other operations) for handing inflight host data when a power loss event occurs. The triggering of the identifier may occur, for example, when the power loss event is detected. Inflight data, i.e., data that is midway through programming, is re-sent by system firmware to latches (acting as buffers) of the NAND memory device, or alternatively be constructed by the NAND memory device and stored in the NAND latches. Rather than unselect the data block, the NAND memory device selects a subsequent erased page within the same block (e.g., BLKx). As an example, the NAND memory device can select the next, immediate erased page with in the same block. In this manner, the page address will be the existing page address during the power loss, plus (+1)1.

Additionally, the NAND memory device utilizes an existing programming voltage ("VPGM"), e.g., the starting programming voltage ("VPGMU"), and programs using the inflight date to the same block. As an example, the programming may include one-pulse programming (or single pulse programming). Additionally, the programming may occur to the next erased page (referenced above) without ramping down the programming pump. The one-pulse programmed data is similar to storing latch data in SLC format but within the same block. When the power is restored and a power up (i.e., power restoration) initialization occurs, the system controller can read the stored data in the SLC format from the same block (BLKx) and relocate the data to a fresh block.

By implementing at least some of the aforementioned steps, a memory system (having the aforementioned controller and NAND memory device) can perform a programming operation while reducing the required energy requirement, which can lead to a lower required amount of stored charge on a hold up capacitor(s). Additionally, the memory system may require fewer power loss protection ("PLP") capacitors, thus reducing the overall cost of the memory system. Further, the memory system may require fewer special SLC memory blocks dedicated to capturing in flight data during power loss, and as a result, improve the overall performance of the NAND memory device.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Figure 7A:
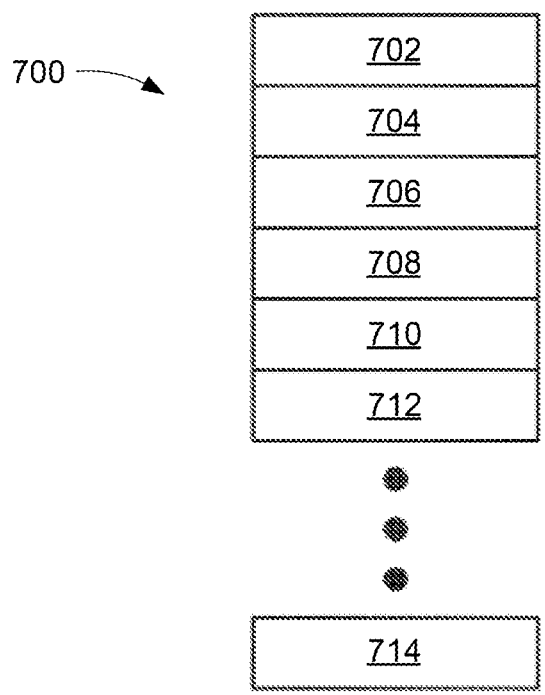
FIG. 7A illustrates a schematic block diagram of an embodiment of a single level cell block, in accordance with some described embodiments.

FIG. 7A illustrates a schematic block diagram of an embodiment of a single level cell block 700. In the illustrated embodiment, the single level cell block 700 includes a first word line 702, a second word line 704, a third word line 706, a fourth word line 708, a fifth word line 710, a sixth word line 712, and an nth word line 714. As may be appreciated, any number of word lines may be between the sixth word line 712 and the nth word line 714. Accordingly, the single level cell block 700 may have any suitable number of word lines. In one embodiment, the single level cell block 700 includes 16 word lines, 32 word lines, 64 word lines, 128 word lines, 256 word lines, and so forth. In various embodiments, each word line may correspond to a number of strings, such as 1, 2, 4, 8, 16, and so forth. For example, in one embodiment, the single level cell block 700 includes 64 word lines, with each word line corresponding to 4 strings for a total of 256 pages (e.g., 64 word lines×4 strings=256 pages). In some embodiments, the first word line 702, the second word line 704, the third word line 706, and the fourth word line 708 may not be used to store data. In such embodiments, the single level cell block 700 is used in a shifted manner to inhibit memory errors. Therefore, in such embodiments, if the single level cell block 700 includes 64 total word lines with each word line corresponding to 4 strings, a total of 240 pages are available for storing data (e.g., 60 word lines×4 strings=240 pages).

Figure 7B:
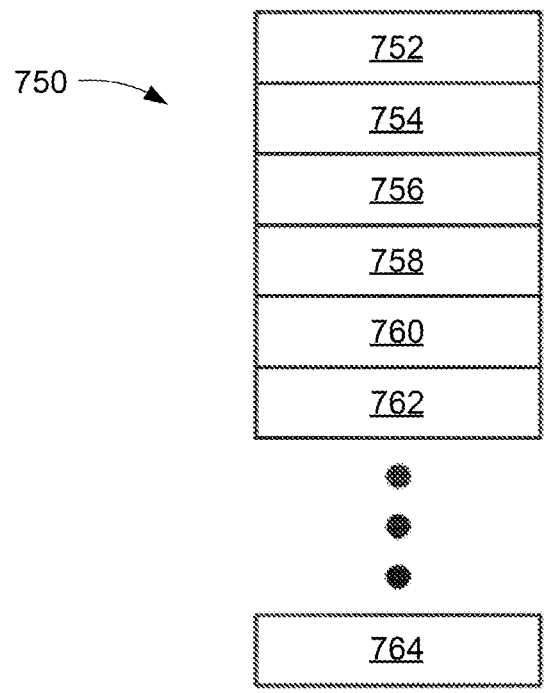
FIG. 7B illustrates a schematic block diagram of an embodiment of a multi-level cell block, in accordance with some described embodiments.

FIG. 7B illustrates a schematic block diagram illustrating an embodiment of a multi-level cell block 750. In the illustrated embodiment, the multi-level cell block 700 includes a first word line 752, a second word line 754, a third word line 756, a fourth word line 758, a fifth word line 760, a sixth word line 762, and an nth word line 764. As may be appreciated, any number of word lines may be between the sixth word line 762 and the nth word line 764. Accordingly, the multi-level cell block 750 may have any suitable number of word lines. In one embodiment, the multi-level cell block 750 includes 16 word lines, 32 word lines, 64 word lines, 128 word lines, 256 word lines, and so forth. In various embodiments, each word line may correspond to a number of strings, such as 1, 2, 4, 8, 16, and so forth. For example, in one embodiment, the multi-level cell block 750 includes 64 word lines, with each word line corresponding to 4 strings for a total of 256 pages (e.g., 64 word lines.times.4 strings=256 pages). In certain embodiments, all word lines of the multi-level cell block 750 may be used to store data.

In some embodiments, data may be first stored in single level cell blocks (e.g., single level cell block 700 in FIG. 7A). In response to sufficient data being stored in single level cell blocks, the data in the single level cell blocks may be copied to multi-level cell blocks (e.g., multi-level cell block 700). In various embodiments, each multi-level cell may be used to store three single level cells. Accordingly, in embodiments in which entire single level cell blocks are used to store data, three single level cell blocks may be copied into one multi-level cell block. For example, one single level cell block may be copied into a lower page of the multi-level cell block, one single level cell block may be copied into a middle page of the multi-level cell block, and one single level cell block may be copied into an upper page of the multi-level cell block. In some embodiments a first data latch (ADL), a second data latch (BDL), and a third data latch (CDL) may hold lower page data, middle page data, and upper page data for one MLC program of the multi-level cell block. The data in single level cell blocks may be held there as a temporary backup to a multi-level cell block into which the data is copied until the multi-level cell block passes one or more tests, such as enhanced post write read (EPWR) checks. After the multi-level cell block passes the one or more tests, the single level cell blocks may be reused for storing additional data.

The memory cells can be programmed to store one or multiple bits in $2^n$ data states where n is a positive integer. For example, FIG. 8 depicts a voltage threshold Vt distribution of a one-bit per memory cell (SLC) memory device. In an SLC memory device, there are two possible data states including the erased state (Er) and a single programmed data state S1. As shown in FIG. 9, in a two bit-per cell memory device (MLC), there are four data states including the erased state and three programmed data states (S1, S2, and S3). As shown in FIG. 10, in a three bit-per cell memory device (TLC), there are eight data states including the erased state and seven programmed data states (S1, S2, S3, S4, S5, S6, and S7). As shown in FIG. 11, in a four bit-per cell memory device (QLC), there are sixteen data states including the erased state and fifteen programmed data states (S1, S2, S3, S4, S5, S6, S7, S8, S9, S10, S11, S12, S13, S14, and S15).

Figure 12:
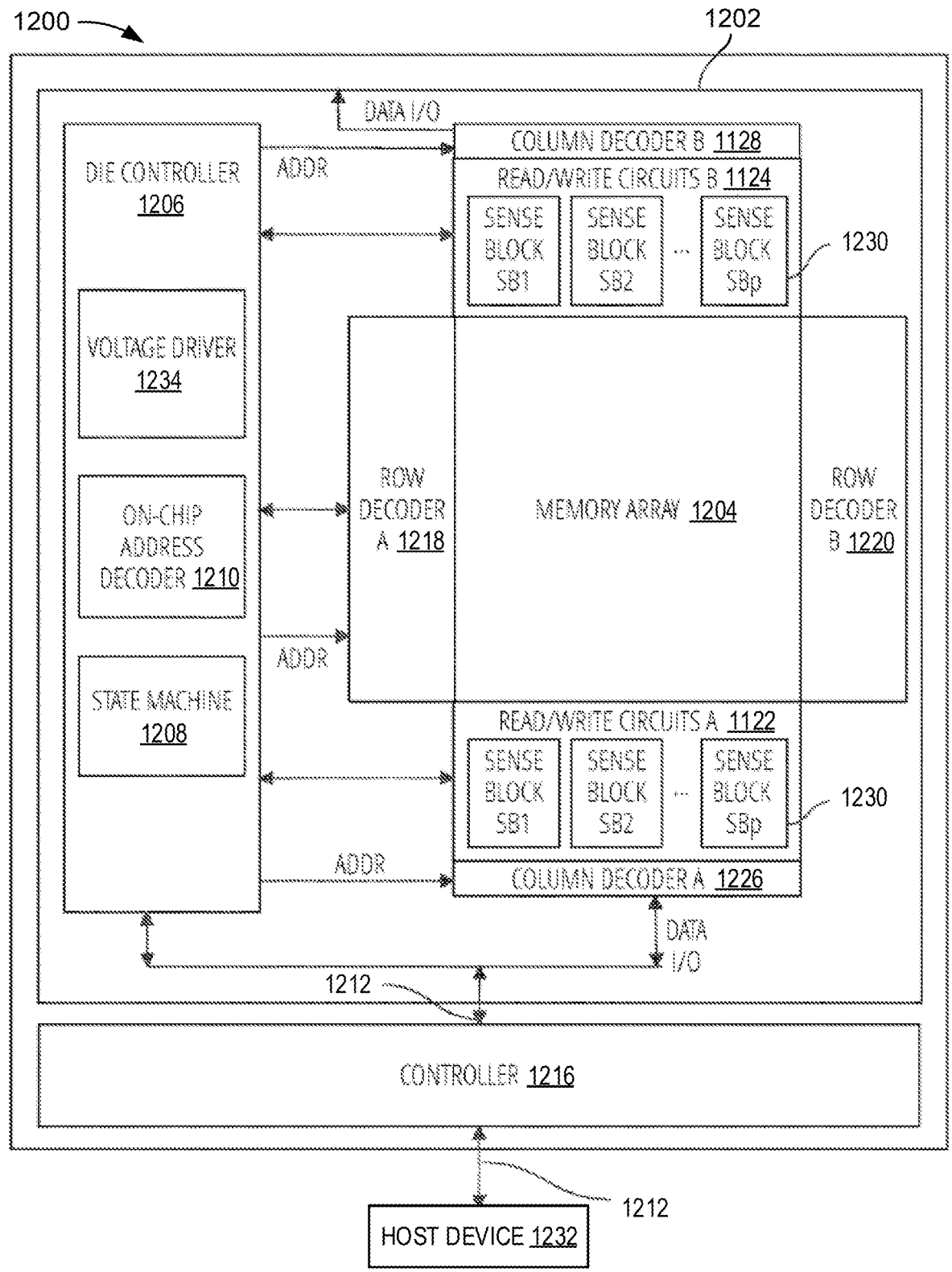
FIG. 12 illustrates an embodiment of a non-volatile storage system that may include one or more memory die(s) or chips.

FIG. 12 illustrates an embodiment of a non-volatile storage system 1200 that may include one or more memory die(s) 1202 or chips. Memory die(s) 1202, in some embodiments, include a memory array 1204 (two-dimensional or three dimensional) of memory cells, die controller 1206, read/write circuits A 1222, and read/write circuits B 1224. In one embodiment, access to the memory array 1204 by the various peripheral circuits is implemented in a symmetric fashion, on opposite sides of the array, so that the densities of access lines and circuitry on each side are reduced by half. The read/write circuits A 1222 and read/write circuits B 1224, in a further embodiment, include multiple sense amplifiers 1230 which allow a page of memory cells to be read or programmed in parallel.

The memory array 1204, in various embodiments, is addressable by word lines via row decoder A 1218 and row decoder B 1220 and by bit lines via column decoder A 1226 and column decoder B 1228. In some embodiments, a controller 1216 is included in the same memory system 1200 (e.g., a removable storage card or package) as the one or more memory die(s) 1202. Commands and data are transferred between the host device 1232 and controller 1216 via lines 1214 and between the controller and the one or more memory die(s) 1202 via lines 1212. One implementation can include multiple memory die(s) 1202.

Die controller 1206, in one embodiment, cooperates with the read/write circuits A 1222 and read/write circuits B 1224 to perform storage/memory operations on the memory array 1204. The die controller 1206, in certain embodiments, includes a voltage driver 1234, a state machine 1208, and an on-chip address decoder 1210. In one embodiment, the state machine 1208 includes at least a portion of the voltage driver 1234. In another embodiment, the controller 1216 includes at least a portion of the voltage driver 1234.

The voltage driver 1234, in one embodiment, is configured to supply a voltage to one or more components of the memory array. The magnitude of the voltage and whether the voltage level supplied is increasing or decreasing depends on the operation that the die controller 1206 is implementing. At one point during an operation, the voltage level provided by the voltage driver 1234 may include an analog signal increasing from ground or zero voltage, or a level substantially close to zero, to a desired voltage level required by components coupled to the voltage driver 1234 to implement the desired operation. As the voltage applied to a component coupled to the voltage driver 1234 increases, the period of time during which the voltage level is changing is referred to herein as charging, pre-charging, or ramping up.

At another point during an operation, the voltage level provided by the voltage driver 1234 may include an analog signal configured to maintain a voltage level required by components coupled to the voltage driver 1234 for a particular stage of implementing a desired operation. As the voltage applied to a component coupled to the voltage driver 1234 remains substantially at the desired voltage level, the period of time is referred to herein as a steady state or stable.

At another point during an operation, the voltage level provided by the voltage driver 1234 may include an analog signal decreasing from a desired voltage level to a lower voltage level, a ground level, or zero voltage, or a level substantially close to zero, for a desired operation. As the voltage applied to a component coupled to the voltage driver 1234 decreases the period during which the voltage level is changing is referred to herein as discharging, post-charging, or ramping down.

The state machine 1208, in one embodiment, provides chip-level control of storage and/or memory operations. The on-chip address decoder 1210 provides an address interface to convert between the address that is used by the host or a memory controller to the hardware address used by the row decoder A 1218, row decoder B 1220, column decoder A 1226a, and column decoder B 1228. The state machine 1208 includes logic for activating and controlling the voltage driver 1234 and other logic coupled to circuits in electrical communication with the voltage driver 1234.

In one embodiment, one or any combination of die controller 1206, voltage driver 1234, on-chip address decoder 1210, state machine 1208, row decoder A 1218, row decoder B 1220, column decoder A 1226, column decoder B 1228, read/write circuits A 1222, read/write circuits B 1224, and/or controller 1216 can be referred to as one or more managing circuits.

Figure 13A:
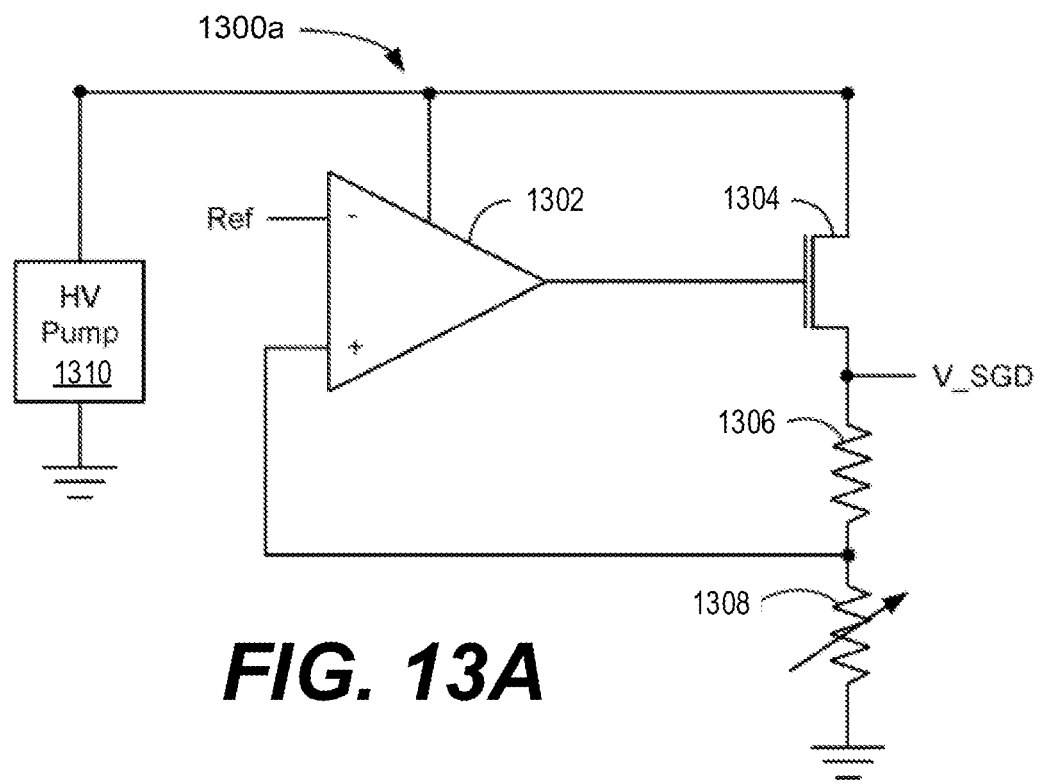
FIG. 13A is a diagram of one embodiment of circuitry that is configured to provide a voltage pulse to an SGD select line.

FIG. 13A is a diagram of one embodiment of circuitry 1326 that is configured to provide a voltage pulse to an SGD select line. The circuitry 1326 may be used to provide a voltage pulse to an SGD select line described herein. The circuitry 1326 includes a high voltage (HV) pump 1310, an operational amplifier 1302, transistor 1304, fixed value resistor 1306, and variable value resistor 1208. The circuitry 1326 has an output that provides voltage V_SGD, which may be provided to the SGD select line.

The HV pump 1310 may include one or more charge pumps and is configured to provide high voltages. The HV pump 1210 provides a high voltage to the operational amplifier 1302. The operational amplifier 1302 output is connected to the gate of transistor 1304. The inverting input of the operational amplifier 1302 is provided with a reference voltage (Ref). The non-inverting input of the operational amplifier 1302 is connected between the fixed value resistor 1306 and the variable value resistor 1308. The value of the variable value resistor 1308 may be adjusted to adjust the magnitude of V_SGD.

Figure 13B:
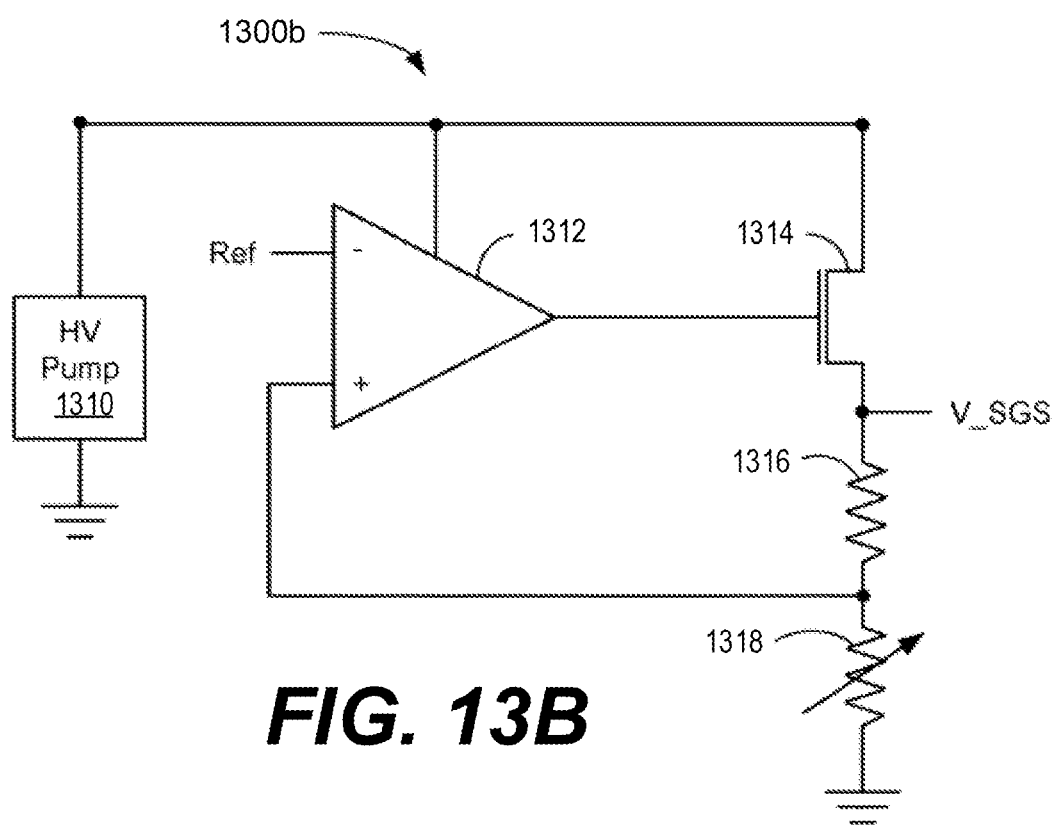
FIG. 13B is a diagram of one embodiment of circuitry that is configured to provide a voltage pulse to an SGS select line.

FIG. 13B is a diagram of one embodiment of circuitry 1328 that is configured to provide a voltage pulse to an SGS select line. The circuitry 1328 may be used to provide a voltage pulse to the SGS select line in FIG. 13A. The circuitry 1328 includes a high voltage (HV) pump 1310, an operational amplifier 1312, transistor 1314, fixed value resistor 1316, and variable value resistor 1318

The circuitry 1328 has an output that provides voltage V_SGS, which may be provided to the SGS select line. In one embodiment, voltage V_SGS is provided to a pathway electrically connected to a strong in a memory block.

The HV pump 1310 may be the same HV pump 1310 that is used with the circuitry 1326. The HV pump 1310 may provide the same voltage to both circuitry 1226 and circuitry 1328. However, it is not required that HV pump 1310 provide the same voltage to both circuitry 1326 and circuitry 1328. The operation of circuitry 1328 is similar to circuitry 1326. The value of fixed value resistor 1316 may be equal to the value of fixed value resistor 1306. However, variable value resistor 1318 may be set to a different resistance than variable value resistor 1308. Thus, even while using the same voltage from HV pump 1310, different magnitude voltages may be provided to the SGS select line and the SGD select line.

In an exemplary programming operation, the controller (e.g., die controller 1206 in FIG. 12) can boost channels for unselected memory cells by applying boosting signals on unselected word lines during a boosting phase of the programming process and applying a voltage signal to the selected word line that ramps up during a ramp up period which is part of the boosting phase. Additionally, when a power loss event during the programming operation, the die controller 1206 (using the state machine 1208) can maintain the programming voltage such that the charge pump (or program pump) is not ramped back down to ground, and the original programming voltage (e.g., VPGMU) is maintained.

Figure 14:
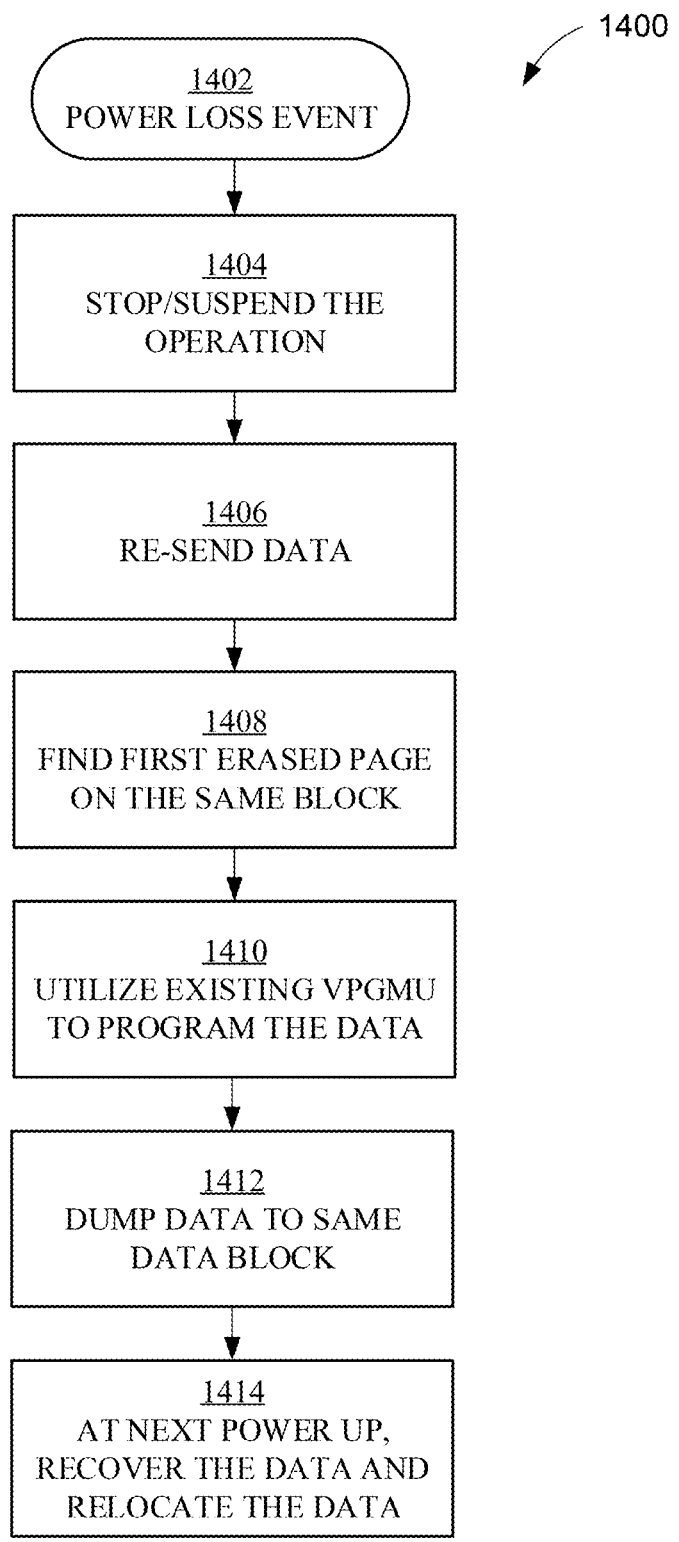
FIG. 14 illustrates a flowchart showing a method for retaining inflight data during a power loss event, in accordance with some described embodiments.

FIG. 14 illustrates a flowchart 1400 showing a method for retaining inflight data during a power loss event, in accordance with some described embodiments. The flowchart 1400 shows and describes a process such that during a programming event to a NAND memory device, the inflight data is not lost. Additionally, a system (e.g., memory system or memory device) used to carry out the steps of the flowchart 1300 may include a controller and a memory circuit. In this manner, the controller may include one or more processing circuits that execute instructions stored on the memory circuit, with the instructions defined in part by the steps in the flowchart 1400.

In step 1402, the method begins with a power loss event and an identification thereof. A number of trigger the system to determine a power loss event. For example, a prefix command to the system can indicate to the system an indication of a power loss protection event to NAND memory device. Alternatively, or in combination, the system may monitor (in real-time or near real-time) electrical current to the NAND memory device.

In step 1404, the programming is suspended. Although programming is halted, the memory block (e.g., TLC or QLC block) that was being programming is not unselected. In this manner, the charge pump (used as a program pump) are not ramped down, i.e., the voltage at is not discharged during the program suspension.

In step 1406, the host data (e.g., TLC or QLC data) to be stored on NAND memory device is re-sent to temporary storage. For example, during a programming event, the host data is temporarily stored on latches in the NAND memory device, with the latches acting as a buffer until the host data can be permanently programmed to the NAND (until erased at a later time, if desired). In response to a power loss event, the data is re-sent to by, for example, controller firmware to NAND latches, or is re-constructed by the NAND memory device and stored on the NAND latches.

In step 1408, the first erased page on the same block is selected. As an example, when block x (BLKx), where is an integer, is being programmed and subsequently suspended due to a power loss event, the immediate/subsequent erased page within BLKx is selected. Accordingly, if the programming operation at the page with the address BLKx, Page i (where i is an integer), was suspended due to the power loss event, then the selected page to be programmed has the address BLKx, Page i+1.

In step 1410, the existing programming voltage is used to program the inflight data. As an example, the existing, or same, programming voltage may include VPGMU, which, based on step 1406, has not undergone a ramping down event. In other words, the existing programing voltage is maintained while a programming suspension occurs. In this manner, the charge pump (i.e., programming pump) is not ramped down, including instances of a suspension of programming. In order to program the inflight data, the controller can use one-pulse programming. Using one-pulse programming, the programming operation may include faster, more efficient charging as well as a lower charge requirement.

Additionally, the programming operation may occur without a verify operation. Also, NAND memory device may include additional advantageous features. For example, the NAND device may include an automatic page increment ("API") mode in which the page address is not required, and the controller can begin to automatically program—3 pages for TLC (e.g., ADL, BDL, and CDL) or 4 pages (e.g., ADL, BDL, CDL, and XDL)—the same block during the power loss event.

In step 1412, the data is programmed to the same data block. The programming operation may be similar to that of storing latch data in SLC format.

In step 1414, when a power up event occurs (after the power loss event), the data is recovered and relocated. A power up event may also refer to a power restoration event, and accordingly, a power up event indicates the original power (lost from the power loss event) is restored. The data can be read from the current location and programmed to the next word line(s), as a non-limiting example. The controller can read the data stored in the SLC format from the same block and relocate to a fresh block.

In some embodiments, each step shown in the flowchart 1400 is used in order to carry out the process. However, in some embodiments not all steps in the flowchart 1400 are required.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for retaining inflight data during a power loss event, the method comprising:
    by a controller of a memory device comprising a memory block:
        receiving an indication of the power loss event;
        suspending, based on the indication, a programming operation of inflight data to a page of the memory block;
        providing the inflight data to a buffer;
        identifying an erased page address on the memory block;
        programming the inflight data to the erased page; and
        when a power restoration event occurs, relocating the inflight data.

2. The method according to claim 1, wherein receiving the indication comprises receiving a prefix command.

3. The method according to claim 1, wherein the erased page defines a next immediate erased page after the erased page.

4. The method according to claim 1, wherein programming the inflight data comprises single pulse programming.

5. The method according to claim 4, further comprising utilizing an initial programming voltage, prior to the power loss event, to perform the single pulse programming.

6. The method according to claim 4, wherein the single pulse programming occurs without ramping down a programming pump.

7. The method according to claim 1, wherein the relocating the inflight data comprises programming the inflight data to a subsequent block of the memory device.

* * * * *